US012601771B2

(12) United States Patent
Kulas et al.

(10) Patent No.: US 12,601,771 B2
(45) Date of Patent: Apr. 14, 2026

(54) SENSOR DEVICE FOR AN ELECTRICAL TERMINAL ARRANGEMENT, ELECTRICAL TERMINAL ARRANGEMENT, ELECTRICAL TERMINAL BLOCK, SWITCHGEAR CABINET AND READ-OUT DEVICE

(71) Applicant: WAGO Verwaltungsgesellschaft mit beschraenkter Haftung, Minden (DE)

(72) Inventors: Sascha Kulas, Hannover (DE); Ulrich Hempen, Minden (DE); Burkhard Niemann, Hille (DE); Thomas Holm, Rinteln (DE); Michael Meyer, Hille (DE); Fabian Schwamborn, Loehne (DE)

(73) Assignee: Wago Verwaltungsgesellschaft mbH, Minden (DE)

( * ) Notice: Subject to any disclaimer, the term of this patent is extended or adjusted under 35 U.S.C. 154(b) by 1419 days.

(21) Appl. No.: 17/121,215

(22) Filed: Dec. 14, 2020

(65) Prior Publication Data

US 2021/0098906 A1      Apr. 1, 2021

Related U.S. Application Data

(63) Continuation of application No. PCT/EP2019/065203, filed on Jun. 11, 2019.

(30) Foreign Application Priority Data

Jun. 13, 2018    (DE) ..................... 20 2018 103 319.0
Jan. 25, 2019    (DE) ..................... 10 2019 101 883.8

(51) Int. Cl.
G01R 21/133        (2006.01)
G01R 1/04          (2006.01)
(Continued)

(52) U.S. Cl.
CPC ............. G01R 21/133 (2013.01); G01R 1/04 (2013.01); G05B 19/042 (2013.01);
(Continued)

(58) Field of Classification Search
CPC ................................. G01R 21/133; G01R 1/04
See application file for complete search history.

(56) References Cited

U.S. PATENT DOCUMENTS 4,419,619 A * 12/1983 Jindrick ............ H02M 3/33515
                                            323/263
7,508,690 B2     3/2009 Albers
(Continued)

FOREIGN PATENT DOCUMENTS

CN        104037511 A      9/2014
CN        105308417 A      2/2016
(Continued)

OTHER PUBLICATIONS

International Search Report dated Aug. 21, 2019 in corresponding application PCT/EP2019/065203.
(Continued)

*Primary Examiner* — Walter L Lindsay, Jr.
*Assistant Examiner* — Milton Gonzalez
(74) *Attorney, Agent, or Firm* — Muncy, Geissler, Olds & Lowe, P.C.

(57)        ABSTRACT

A sensor device for a terminal block arrangement including at least one sensor for measuring a physical quantity of the terminal block arrangement or of at least one terminal block of the terminal block arrangement.

26 Claims, 9 Drawing Sheets

(51) Int. Cl.

| | |
|---|---|
| *G05B 19/042* | (2006.01) |
| *H01R 9/26* | (2006.01) |
| *H02B 1/052* | (2006.01) |
| *H04B 5/22* | (2024.01) |
| *H04B 5/24* | (2024.01) |
| *H04W 4/80* | (2018.01) |
| *H04B 5/45* | (2024.01) |

(52) U.S. Cl.
CPC ......... *H01R 9/2625* (2013.01); *H01R 9/2675* (2013.01); *H02B 1/052* (2013.01); *H04B 5/22* (2024.01); *H04B 5/24* (2024.01); *H04W 4/80* (2018.02); *H04B 5/45* (2024.01)

(56) References Cited

U.S. PATENT DOCUMENTS

| | | | | |
|---|---|---|---|---|
| 7,855,873 | B2 * | 12/2010 | Darr ....................... | H02B 1/056 |
| | | | | 361/628 |
| 8,128,430 | B2 * | 3/2012 | Diessel ................ | H01R 31/085 |
| | | | | 439/507 |
| 9,081,033 | B2 * | 7/2015 | Hackemack ......... | H01R 9/2666 |
| 9,099,880 | B2 | 8/2015 | Wesemann et al. | |
| 9,170,279 | B2 | 10/2015 | Bent et al. | |
| 9,559,024 | B2 | 1/2017 | Beyer | |
| 9,589,163 | B2 * | 3/2017 | Jurisch ................... | H02K 11/20 |
| 9,674,972 | B2 | 6/2017 | Kalhoff et al. | |
| 9,933,460 | B2 * | 4/2018 | Rohr .................. | G01R 19/0092 |
| 10,003,863 | B2 | 6/2018 | Louzir et al. | |
| 10,028,404 | B2 | 7/2018 | Wehrle et al. | |
| 10,154,603 | B2 | 12/2018 | Molnar et al. | |
| 10,165,085 | B2 | 12/2018 | Meyer-Graefe | |
| 10,178,795 | B2 | 1/2019 | Possel-Doelken et al. | |
| 2006/0055498 | A1 | 3/2006 | Darr et al. | |
| 2009/0206823 | A1 * | 8/2009 | Armstrong ......... | G01R 1/06788 |
| | | | | 324/114 |
| 2014/0016483 | A1 * | 1/2014 | Patel ....................... | H04L 43/50 |
| | | | | 370/252 |
| 2016/0322804 | A1 * | 11/2016 | Marmonier ........ | G01R 31/3272 |
| 2017/0276706 | A1 * | 9/2017 | Kajjam .............. | G01R 19/2513 |
| 2019/0353687 | A1 * | 11/2019 | Bona ...................... | G01R 11/04 |

FOREIGN PATENT DOCUMENTS

| | | | |
|---|---|---|---|
| CN | 105393350 | A | 3/2016 |
| CN | 106124992 | A | 11/2016 |
| CN | 205693173 | U | 11/2016 |
| DE | 4410817 | C1 | 2/1995 |
| DE | 102005028735 | A1 | 12/2006 |
| DE | 202008015306 | U1 | 4/2010 |
| DE | 102008064450 | A1 | 6/2010 |
| DE | 102009003846 | A1 | 11/2010 |
| DE | 102011110252 | A1 | 12/2012 |
| DE | 102012110173 | A1 | 6/2014 |
| DE | 102013207760 | A1 | 10/2014 |
| DE | 102014104728 | A1 | 10/2015 |
| DE | 102015104922 | A1 | 10/2016 |
| DE | 102015113646 | A1 | 2/2017 |
| DE | 202016104456 | U1 | 11/2017 |
| DE | 102016122157 | B3 | 5/2018 |
| EP | 2421344 | A2 | 2/2012 |
| EP | 3187886 | A1 | 7/2017 |
| FR | 2928478 | A1 | 9/2009 |
| JP | 2000347720 | A * | 12/2000 |
| JP | 2014026727 | A * | 2/2014 |
| WO | WO2009064769 | A1 | 5/2009 |
| WO | WO2016156131 | A2 | 10/2016 |

OTHER PUBLICATIONS

International Preliminary Report on Patentability dated Dec. 24, 2020 in corresponding application PCT/EP2019/065203.

* cited by examiner

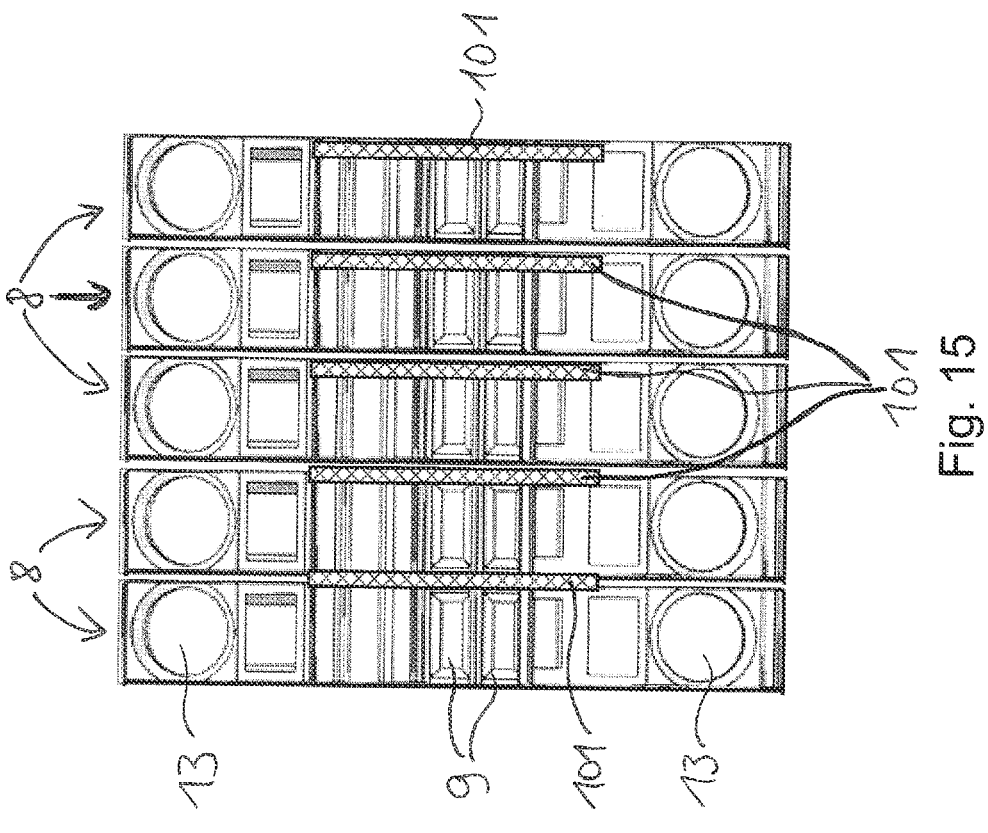
Fig. 15
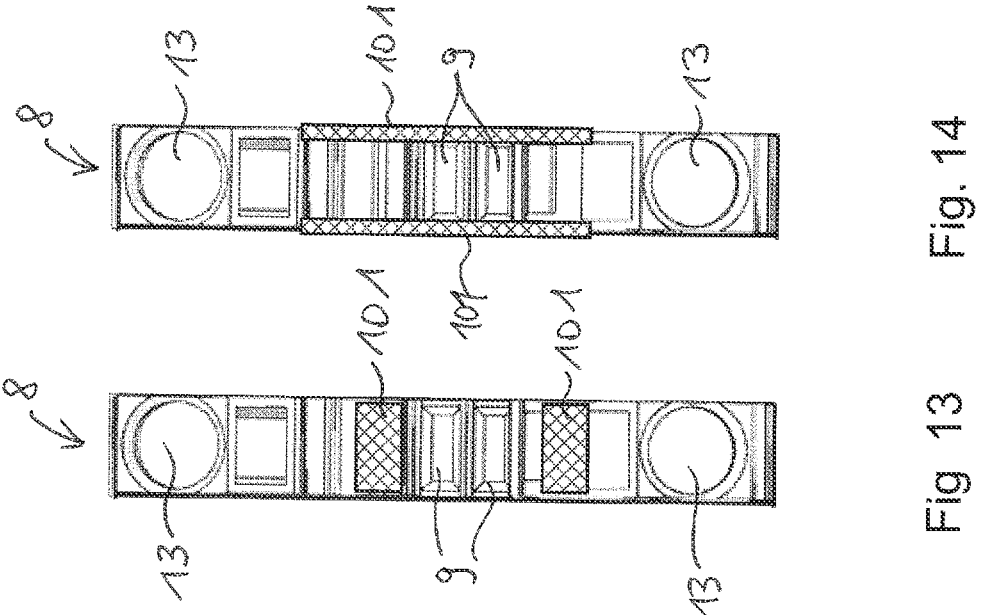
Fig. 14
Fig 13

SENSOR DEVICE FOR AN ELECTRICAL TERMINAL ARRANGEMENT, ELECTRICAL TERMINAL ARRANGEMENT, ELECTRICAL TERMINAL BLOCK, SWITCHGEAR CABINET AND READ-OUT DEVICE

This nonprovisional application is a continuation of International Application No. PCT/EP2019/065203, which was filed on Jun. 11, 2019, and which claims priority to German Patent Application No. 10 2019 101 883.8, which was filed in Germany on Jan. 25, 2019, and which claims priority to German Patent Application No. 20 2018 103 319.0, which was filed in Germany on Jun. 13, 2018 and which are all herein incorporated by reference.

BACKGROUND OF THE INVENTION

Field of the Invention

The present invention relates to a sensor device for a terminal block arrangement, wherein the sensor device has at least one sensor for measuring a physical quantity of the terminal block arrangement or at least one terminal block of the terminal block arrangement. The invention also relates to a terminal block arrangement and to a terminal block, a control cabinet with at least one such terminal block arrangement and/or terminal block, as well as a readout device.

Description of the Background Art

Terminal blocks are used in various ways in electrical installation technology. Terminal blocks are usually attached to a mounting rail and lined up side by side to provide a variety of electrical connection options for electrical conductors. A more common application of terminal blocks is to mount these in a control cabinet. The terminal blocks then form a terminal block arrangement. Such a terminal block arrangement is known, for example, from DE 20 2016 104 456 U1, which is incorporated herein by reference.

SUMMARY OF THE INVENTION

It is therefore an object of the present invention to specify a possibility for a user to measure physical quantities of the terminal block arrangement, such as current, voltage, temperature, that is easy to use.

This object is achieved in an exemplary embodiment by a sensor device for a terminal block arrangement, the sensor device having at least one sensor for measuring a physical quantity of the terminal block arrangement or of at least a terminal block of the terminal block arrangement. This makes it possible, depending on the embodiment of the at least one sensor, to measure virtually any physical quantity of the terminal block arrangement. The sensor device can also include a plurality of sensors, e.g. sensors for measuring different physical quantities such as current and voltage.

The sensor device can be formed as a structural unit that is separate from the terminal block arrangement, which, if necessary, the user can fasten to a terminal block or between terminal blocks of a terminal block arrangement. This has the advantage that the user can install one or more sensor devices at the desired location as needed in order to determine physical quantities of the terminal block arrangement. There is no need to completely redesign the terminal block arrangement or the cabinet for this purpose. The sensor device allows for simple and reliable placement at the desired location of the terminal block arrangement or terminal block, as will be explained below.

The sensor device can have a wireless transmission unit, which is set up for the wireless transmission of measured values from the at least one sensor of the sensor device to a readout device that is separate from the sensor device. This has the advantage that there is no need for attaching any complicated wiring to the terminal block arrangement or in the cabinet, in order to provide and forward the measured values from the sensor device. Instead, the transmission of the measured values can be done wirelessly, for example by radio transmission, inductive or capacitive coupling or optical data transmission. In particular, a UHF wireless transmission can be made, e.g. with a transmission link within the control cabinet. The sensor device may, for example, include a separate RFID transponder and/or a wireless transmitter, so that the measured values can be transmitted wirelessly via Wi-Fi transmission to an evaluation device.

The sensor device can have a first wireless transmission unit for the transmission of measured values from a current measured by the sensor device and at least one second wireless transmission unit for the wireless transmission of measured values from a voltage or potential measured by the sensor device. In this way, the current and voltage of an electrical line can be measured. This makes it possible, for example in an external readout device or an evaluation device, to determine the electrical power and accordingly carry out a power measurement in the terminal block. The sensor device may be formed with the first and second wireless transmission unit as one structural unit or as separate structural units, e.g. by one structural unit of the sensor device comprising the first wireless transmission unit and the other structural unit comprising the second wireless transmission unit.

The sensor device can be supplied with the electrical energy required for operating the sensor device, for example, through an electrical line. It is also advantageous to equip the sensor device with its own electrical energy source, for example an accumulator or a battery. In this case, no electrical line has to be laid to the sensor device for supplying energy.

The sensor device can also receive its energy supply directly from the physical quantity, e.g. a current and/or a voltage, that is measured by the sensor. In case of contactless current measurement, the electrical energy can, for example, be derived from the magnetic field generated by the current to be measured.

The sensor device can be set up to be wirelessly supplied with electrical energy, which is required for the operation of the sensor device. This has the advantage that the sensor device can be made available without its own energy source. In addition, there is no need for separate cabling in order to supply electrical energy through electrical lines to the sensor device. This also simplifies the installation of the sensor device on the terminal block arrangement. In addition, maintenance is simplified since no separate energy source of the sensor device needs to be replaced or charged. The transmission of energy can, for example, take place by radio transmission, inductive or capacitive coupling or optical transmission.

If optical energy transmission is carried out, the sensor module can be designed having one or more solar cells, for example, to generate electrical energy therefrom that is required to operate the sensor module. In the case of inductive or capacitive transmission, the sensor module, for example, can be inductively or capacitively supplied with electrical energy by a neighboring terminal block.

The sensor device can have an energy harvesting device that is set up to wirelessly receive electrical energy from the environment of the sensor device and to provide the electrical energy to supply the components of the sensor device with power. In this way, virtually any number of energy sources in the area can be tapped and used to supply the sensor device with power.

In addition to the measured values of the at least one sensor, the sensor device can also provide additional data, e.g. an identification code, which can be used to identify the sensor device. In this way, it is possible to distinguish between the measured values from different sensor devices with little effort, especially in the case of wireless transmission.

The sensor device may be designed as a sensor module, that is, as a structural unit, which comprises all the components required to operate the sensor device. The sensor module can, e.g., be manufactured as an MID (Molded Interconnect Device). In this case, all components including the electronics of the sensor module can be injected into a plastic material. The sensor device can also include separate components such as the at least one sensor, an antenna and/or an electronic assembly. These separate components can, e.g., be arranged distributed in a terminal block and be electrically connected to each other. The sensor device can in particular have a dipole antenna.

The sensor device can have an RFID transponder. This has the advantage that the previously described embodiments of the invention, such as wireless transmission of measured values or wireless data communication in general and wireless supply of electrical energy, can be realized with little effort and with compact components, namely an RFID transponder. RFID technology is already widespread. The inventors have found that RFID technology is well suited for use in such sensor devices for a terminal block arrangement.

The sensor device can be designed as a lateral end plate of a terminal block. This represents a further advantageous possibility of attaching the sensor device to the terminal block arrangement. In many configurations, terminal blocks have a housing which is open on one side and which is closed by an adjacent terminal block. In such cases, a lateral end plate is attached to the last terminal block of the terminal block arrangement, so that this last terminal block is also closed. According to the invention, it is proposed to use such a side end plate to accommodate the sensor device. Depending on the embodiment of the sensor device, the lateral end plate comprising the sensor device may have the same width as a standard lateral end plate or be slightly wider. The end plate can also have the same width as a terminal block. This provides a bridge beyond the end plate.

The lateral end plate completely or predominantly surrounds the sensor and/or an electronic assembly of the sensor device in the manner of a housing. In this way, the sensor and/or the electronic assembly is protected by the end plate against harmful environmental influences.

The end plate can also be designed as an angled end plate. An angled front area of the end plate, which is arranged at an angle to a coverage area of the end plate to be arranged laterally on the terminal block, covers at least a portion of the front side of the terminal block. In particular, the antenna of the sensor module can then be arranged in the angled front area. Here, those portions of the front side of the terminal block that are required to connect electrical lines or jumpers, or those portions for label fields, can remain free.

The at least one sensor can be disposed at a position of the lateral end plate, in particular said sensor device is arranged at a position of the coverage area of the end plate that is to be arranged laterally on the terminal block, or is arranged on any other housing of the sensor device, which is arranged on a terminal block in the area of the busbar of the terminal block when the lateral end plate or the other housing of the sensor device is attached as intended. In this way, the correct positioning of the at least one sensor relative to the terminal block can be ensured by the structural design of the end plate or the other housing of the sensor device. This is of great advantage, e.g., for wirelessly current sensing. Since the lateral end plate is to be fastened to the terminal block via fasteners associated with the latter, due to the mutually associated terminal block fasteners and the end plate, the end plates are set in a defined, designated position on the terminal block. Due to this association, it can already be ensured at the corresponding placement of the at least one sensor in the end plate or the other housing that the at least one is sensor is arranged at a desired location, adjacent to the terminal block when the end plate or the other housing is mounted on or adjacent to the terminal block in the designated manner.

The at least one sensor can be arranged in the end plate at a distance from outer edge regions of the end plate. The at least one sensor is therefore not arranged on or near the outer edge of the end plate, but tends to be more central.

The sensor device can be inserted in a jumper slot or another slot of a terminal block housing on the terminal block and can be fastened in the slot. This allows for the sensor device to be easily mounted and accommodated on the terminal block. Depending on the configuration, the sensor device can already be secured by the insertion into the slot (jumper slot or another slot) of the terminal block, or be attached thereto by a separate fastener such as a latching and/or clamping element, or by an adhesive.

At least in its front area having the at least one sensor, the sensor module can be designed like a jumper of a terminal block. In particular, this allows for a defined insertion and engagement of the sensor module in the jumper slot or another slot of the terminal block. This also provides the user with haptic feedback when the sensor module is correctly placed in the slot.

If the sensor device is inserted in the slot, it is advantageous if the area of the sensor device protruding from the slot, for example, the area with the antenna, does not cover certain areas of the terminal blocks, such as the label fields. This can be implemented, for example, because the area of the sensor device protruding from the terminal block is formed relatively narrow, e.g. by the antenna being formed as a rod antenna, or by this region having recesses or by being at least partially transparent.

The sensor device can be formed as a structural unit that is compatible with terminal blocks, which can be arranged between terminal blocks of the terminal block arrangement and can be snapped onto a mounting rail carrying the terminal blocks. This represents a further advantageous possibility of accommodating the sensor device on the terminal block arrangement. The sensor device can, e.g., have a housing that corresponds to the housing of a terminal block in terms of its outer design and mounting options. In particular, the sensor device can have fasteners for fastening to the mounting rail. Depending on the embodiment, the housing of the sensor device can have the same width as a terminal block, or be wider or more narrow. It is particularly advantageous if the sensor device is sized to be compatible with a defined grid dimension of the terminal block arrangement.

As such, no additional connections or cabling are required when mounting the sensor device on the terminal block or the terminal block arrangement. By the nature of its positioning, the sensor of the sensor device may by automatically arranged in the sensor device in such a way that the desired measuring of the physical quantity is possible by means of the at least one sensor of the sensor device. If the sensor is to measure a current, for example, then the sensor is arranged in the sensor device in such a way that when the sensor device is attached to the terminal block as intended, the sensor is automatically positioned near the busbar of the terminal block arrangement.

The sensor device can comprise at least one antenna, wherein the at least one sensor of the sensor device is disposed at one end of the sensor device and the least one antenna is disposed at the opposite other end of the sensor device. This has the advantage that the sensor device is optimized both with regard to the measuring of the physical quantity by the at least one sensor and also with regard to the communication with the readout device. In this way, the sensor can be conveniently positioned at a point on the terminal block where the physical size can be easily measured. By its location at the opposite other end of the sensor device, the antenna can, for example, protrude from the terminal block or the terminal block arrangement and accordingly provide good radiation options for the wireless transmission.

The sensor device can partially protrude from the terminal block arrangement, in particular with the area having the antenna. This also has a positive effect on the wireless transmission of the measured values and the electrical energy. If the sensor device is inserted, for example, in a jumper slot or another slot of a terminal block housing, then the area comprising the antenna can still protrude from this slot.

The at least one sensor of the sensor device can, for example, be a current sensor for measuring the electric current, e.g. the current through a busbar of the terminal block arrangement, a voltage sensor, a temperature sensor, a humidity sensor, an acceleration sensor, a vibration sensor or any other sensor. The sensor device can also contain multiple identical, or different, sensors. There may be additional sensors.

The at least one sensor can be a current sensor, such as a shunt. The at least one sensor can also be a contactless current sensor. For example, the current sensor can be designed as an AMR sensor, Magnetic Dependent Resistor (MDR) or Hall sensor. This allows for contactless measuring of the electrical current via the magnetic field generated by the electrical current. This also simplifies the subsequent attachment of the sensor device to the terminal block arrangement. A further advantage of such a current sensor consists in the fact that high currents, for example, over 100 amps, as well as low currents of less than 1 amp can be measured equally well.

The at least one sensor can be a voltage sensor, or a further sensor of the sensor device is a voltage sensor. The voltage sensor can be a contactless voltage sensor, e.g. a capacitive sensor. This allows for contactless measuring of the electrical voltage through capacitive coupling into the voltage sensor. This also simplifies the subsequent attachment of the sensor device to the terminal block arrangement.

The sensor device can be set up to measure at least two or at least three voltage potentials of the terminal block arrangement or of at least one terminal block of the terminal block arrangement. If there are connection options for the measuring of two voltage potentials, the voltage potential of the neutral conductor can be measured as a reference voltage value, for example. In addition, with the other connection option, a voltage-conducting line such as a phase of a three-phase network with regard to the voltage potential can be measured. In this way, the voltage can be measured on a phase, for example. If more connection options for the measuring of further voltage potential is present, then the voltages of two or all three phases of a three-phase network or any other electrical supply can be measured.

The voltage can be determined from the measured voltage potentials in the sensor device, from an external readout device or a separate evaluation device. For example, the voltage potential readings can be wirelessly transmitted to the readout device, and thus, the corresponding voltage value and, together with the measured current value, the power value, can be determined in the readout device.

Accordingly, a three-phase power measurement of a terminal block arrangement can be implemented in a simple manner and with little retrofitting.

The sensor device can be set up to measure the phase position of a current measured by the sensor device with respect to a voltage potential measured by the sensor device. In this way, phase information of the electric data can be obtained, thereby further improving the monitoring of the terminal block arrangement or the cabinet. Depending on the circuit design of the sensor device, further information can also be obtained, e.g. information about the voltage such as frequency, phase, magnitude, rms value and/harmonics.

The object mentioned above is also achieved by a terminal block arrangement having a plurality of terminal blocks and having at least one sensor device of the type described above. This also realizes the advantages described above. The sensor device can be installed permanently or detachably on the terminal block arrangement. For example, each of the terminal blocks of the terminal block arrangement can have a sensor device of the type described above.

The object mentioned above is also achieved by a terminal block with at least one sensor device of the type previously described. Hereby, the previously described advantages are also realized. The sensor device can be installed permanently or detachably on the terminal block, for example as part of the terminal block production process. A plurality of sensor devices can also be installed on a terminal block, for example, a sensor device for measuring current values and a sensor device for measuring voltage values.

The object mentioned above is additionally achieved by a cabinet having at least one terminal block arrangement of the previously mentioned type and/or at least one terminal block of the previously mentioned type. Hereby, the previously mentioned advantages are also realized.

According to an embodiment of the invention, it is provided that a readout device for reading out measured values from one or more sensor devices of the terminal block arrangement is disposed in the cabinet. This has the advantage that the measured values from the sensor device only have to travel a short transmission link to the readout device. This is particularly advantageous for wireless transmissions, both with regard to the measured values and with regard to the supply of electrical energy. For example, the readout device can have a transponder readout device. In this way, the readout device provides both the reading of the measured values by wireless transmission and the wireless supply of the sensor device with electrical energy.

The object mentioned above is also achieved by a readout device for reading out measured values from one or more sensor devices in the terminal block arrangement. Here also, the previously mentioned advantages are realized.

The readout device can also already contain an evaluation device for the evaluation of the measured values. Alternatively, the readout device can be connected to a remotely located evaluation device, for example, via electrical lines or via wireless transmission. For example, the readout device can be connected to a Wi-Fi unit or contain such a unit, via which the measured values are wirelessly transmitted to the evaluation device.

The reading device can be arranged on the inside of a door of the control cabinet. This has the advantage that the readout device is particularly close to one or more sensor devices in the control cabinet, at least when the door of the control cabinet is closed. This way, the wireless transmission only needs to travel a very short distance.

To this end, it is particularly advantageous if an antenna of the sensor device is arranged at a location of the terminal block that is furthest from the mounting rail fasteners of a terminal block, for example on the housing side remote from the mounting rail fasteners, or if at this position, the sensor device with the antenna extends away a little from the mounting rail or if the antenna can be swiveled and/or optimally oriented towards the readout device.

The readout device can contain, for example, a UHF/MW RFID reader and a gateway. The readout device wirelessly reads out the measured values from various sensor devices of the terminal block arrangement. The readout device acts as a transmitter and sends out a UHF/MW signal that is picked up, modified and re-emitted by the sensor devices. The signal re-emitted by the sensor devices contains the information about the measured value of the at least one sensor. This signal is received from the readout device, which now acts as receiver, and is converted to a corresponding format and forwarded via different interfaces, for example GSM, Wi-Fi. The readout device can also serve as a measuring transducer and for normalizing the measured values and signals. The readout device can, for example, have a cloud connection via Wi-Fi. The readout device thus functions as a multicommunicator.

The readout device can use the gateway to transmit measured values and other data to an evaluation device or to receive data from an evaluation device. The gateway can, for example, be a wireless interface for data communication, e.g. GSM, Wi-Fi.

In order to increase the measuring accuracy of the sensor device, for example, a software-based calibration of the measured values can be performed, for example by already performing the calibration in the sensor device using a calibration curve stored in the sensor device, or by performing the calibration in the readout device using a calibration curve stored in the readout device. The readout device can then select the calibration curve that is suitable for the sensor device from a variety of calibration curves based on the unique identifier of the sensor device. An in situ calibration using an external ammeter is also possible.

The readout device can be set up to use current and voltage readings, which the readout device has read out from one or more sensor devices of the terminal block arrangement, to determine a power measurement value. This allows for even more precise monitoring of the terminal block arrangement and thus the control cabinet.

The invention thus allows for a three-phase power measurement in the control cabinet in a simple manner. UHF-RFID technology and magnetic field sensors can provide the basis for implementing the invention. The hardware for the three-phase power measurement can be very easily integrated in a terminal block during manufacture due to the realizable size or can be relatively simply subsequently mounted on the terminal block.

In the context of the present invention, the undefined term "a" is not to be understood as a numerical word. For example, when a component is mentioned, this is to be interpreted as "at least one component". As far as angles are provided in degrees, these are made based on a circle of 360 degrees (360°).

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIGS. 13, 14 show a front view of a terminal block;

FIG. 15 is a front view of a terminal block arrangement having 5 terminal blocks.

DETAILED DESCRIPTION

Figure 1:
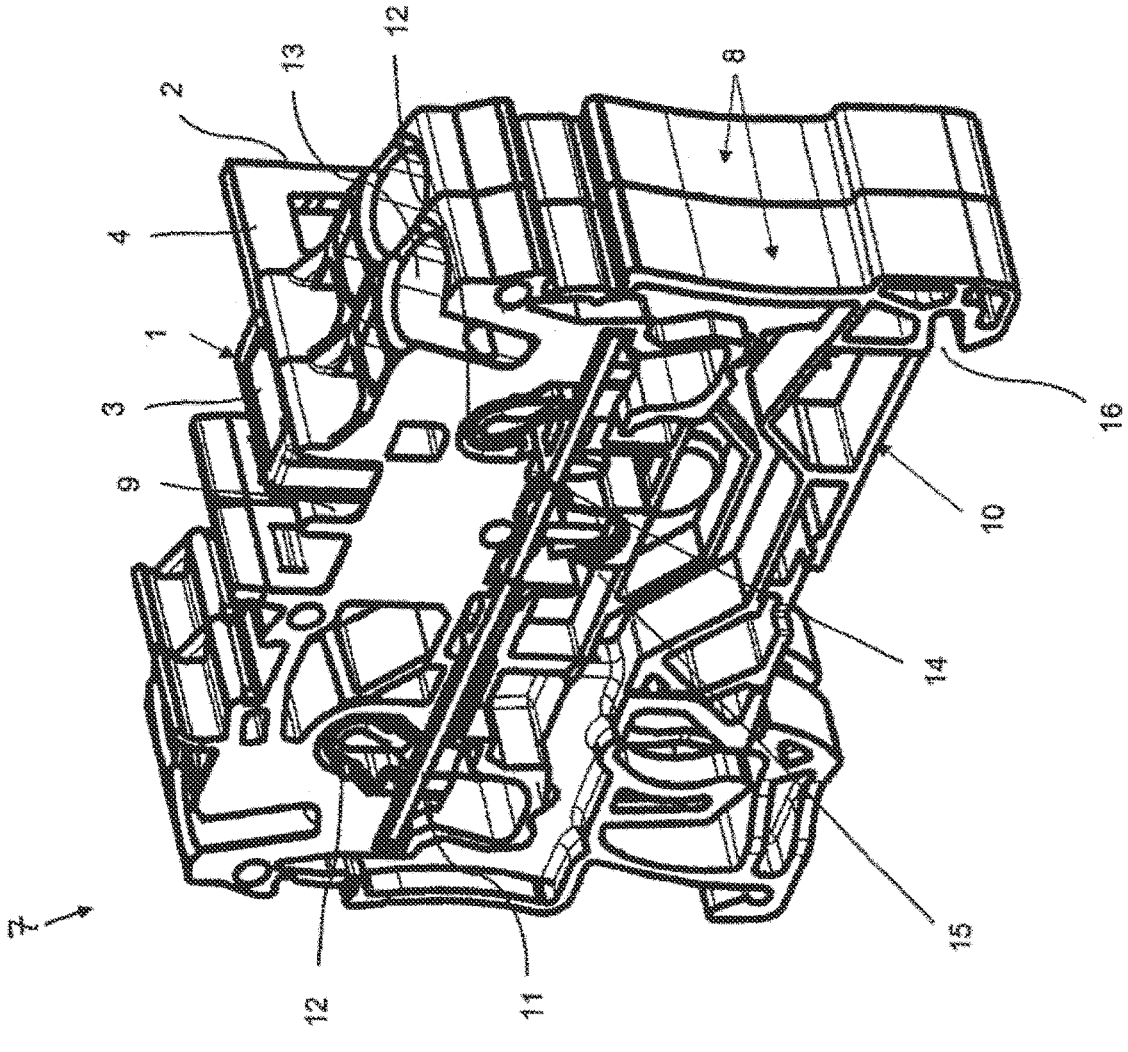
FIG. 1 is a perspective view of a terminal block arrangement with two terminal blocks arranged side by side.

FIG. 1 shows a perspective view of a terminal block arrangement 7 with two terminal blocks 8 arranged side by side. These terminal blocks 8 are each mutually adapted in such a way that plug openings designed as jumper slots 9 are aligned in one direction at the top of the insulating material housing 10 of the terminal blocks 8.

It can be seen that the terminal blocks 8 each have at least one busbar 11 with spring clip terminals 12 for clamping electrical conductors to the busbar 11, which are introduced in a conductor insertion opening 13 in the insulating material housing 10. In the busbar 11, a plug-in opening 14 is further provided, wherein the jumper slot 9 introduced in the insulating material housing 10 in the terminal block 8 leads to the plug-in opening 14. In the illustrated embodiment, a clamping spring 15 is additionally installed in the plug-in opening 14 of a terminal block 8 so as to press a plug-in tongue 2 of an adjacent jumper 1 inserted in the plug-in opening 14 onto the plug-in tongue 2 by spring force, thus improving the current transition.

On their side opposite the jumper slot 9, the terminal blocks 8 have a clip base 16, which is provided in the basically known manner for snapping the terminal blocks 8 onto a mounting rail.

It can be seen that the adjacent jumper 1 shown has a web 4 having further plug-in tongues projecting therefrom and laterally extending beyond these two shown terminal blocks 8. The number of plug-in tongues of an adjacent jumper 1 and thus the length of the web 4 is almost arbitrary and depends on the particular need.

Figure 2:
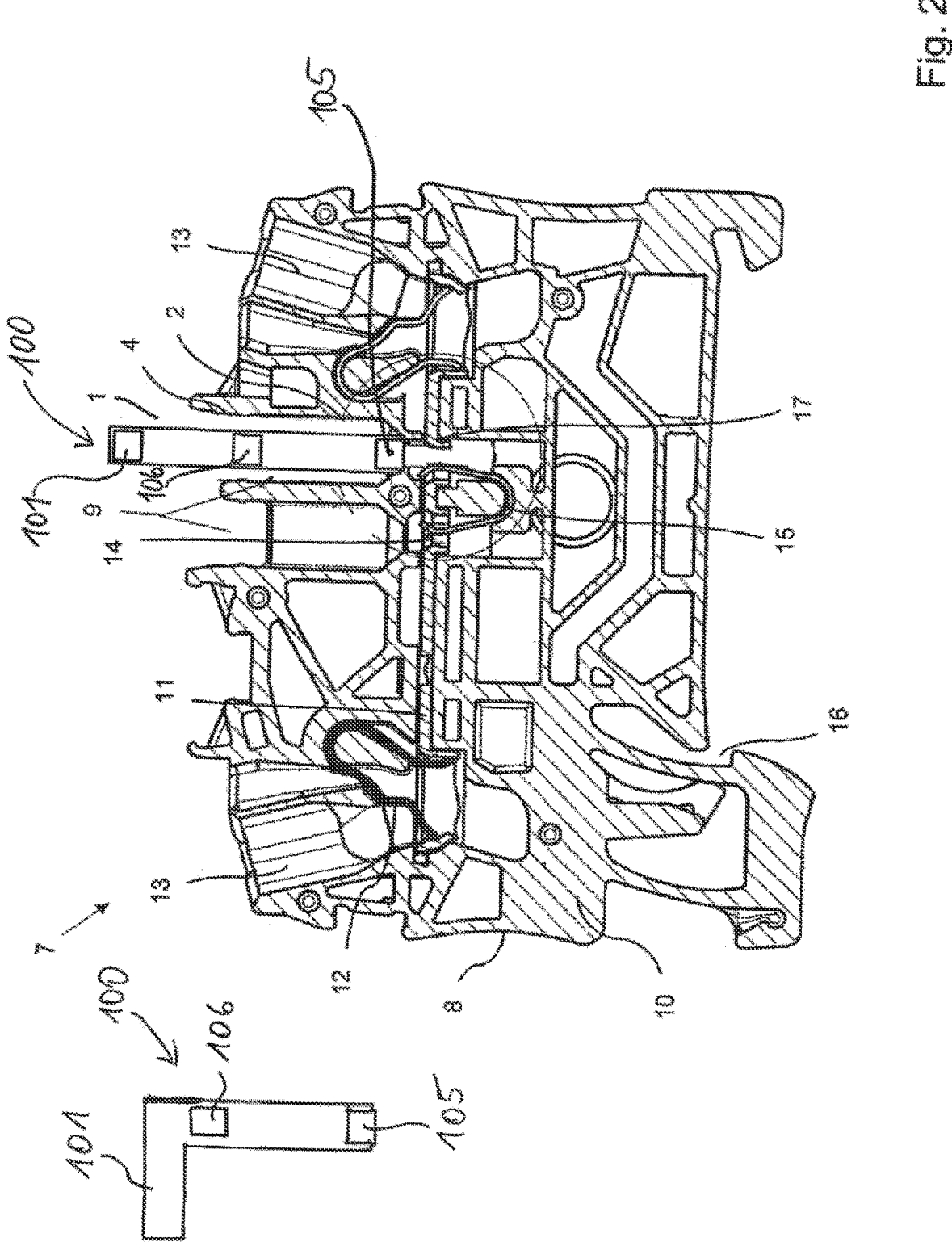
FIG. 2 is a lateral sectional view of a terminal block of the terminal block arrangement according to FIG. 2.

The view according to FIG. 2 illustrates that an inventive sensor device 100 can be used on a terminal block 8 of the previously described terminal block arrangement 7, for example to measure the current flowing through the bus bar 11. For this purpose, the sensor device 100 can, for example, be inserted into a jumper slot 9 and be fastened there, for example, by a clamp fastening, latching or adhesive fastening.

The sensor device 100 arranged in the jumper slot 9 has a slender, elongated shape. At one end of the sensor device, which is arranged in the vicinity of the busbar 11, there is a sensor 105 of the sensor device 100, for example a contactless current sensor. At the other end of the sensor device 100 there is an antenna 101 of the sensor device 100. The area of the antenna 101 of the sensor device thus protrudes from the terminal block 8, which is favorable for wirelessly transmitting measured values to the readout device and for wirelessly supplying the sensor device 100 with electrical energy. In addition to the components already described the sensor device 100 generally has further electrical and/or electronic components, which are shown in simplified form in FIG. 2 as an electronic assembly 106. The electronic assembly 106 can be arranged in the sensor device between the sensor 105 and the antenna 101.

On the left, next to the terminal block 8, FIG. 2 shows an alternative embodiment of the sensor device 100, which is set up for mounting in the jumper slot 9 or another slot of the terminal block 8. The embodiment of the sensor device 100 shown on the left is characterized by an angled shape. A region of the sensor device 100 that can be plugged into the jumper slot 9 or another slot of the terminal block 8 in turn includes the at least one sensor 105 and the electronic assembly 106. The antenna 101 is arranged in a top region of the sensor device 100 formed at an angle thereto. This has an advantageous effect on the wireless transmission of the measured values and the energy. The sensor device 100 can have a fixed (rigid) angled shape, for example at an angle of approximately 90 degrees. The sensor device 100 can also have a joint, as will be described below with reference to the embodiment of FIG. 8. The hinge allows for the antenna to be aligned at a desired angle. The angle can then be determined by the user.

Figures 3, 4, 5, 6:
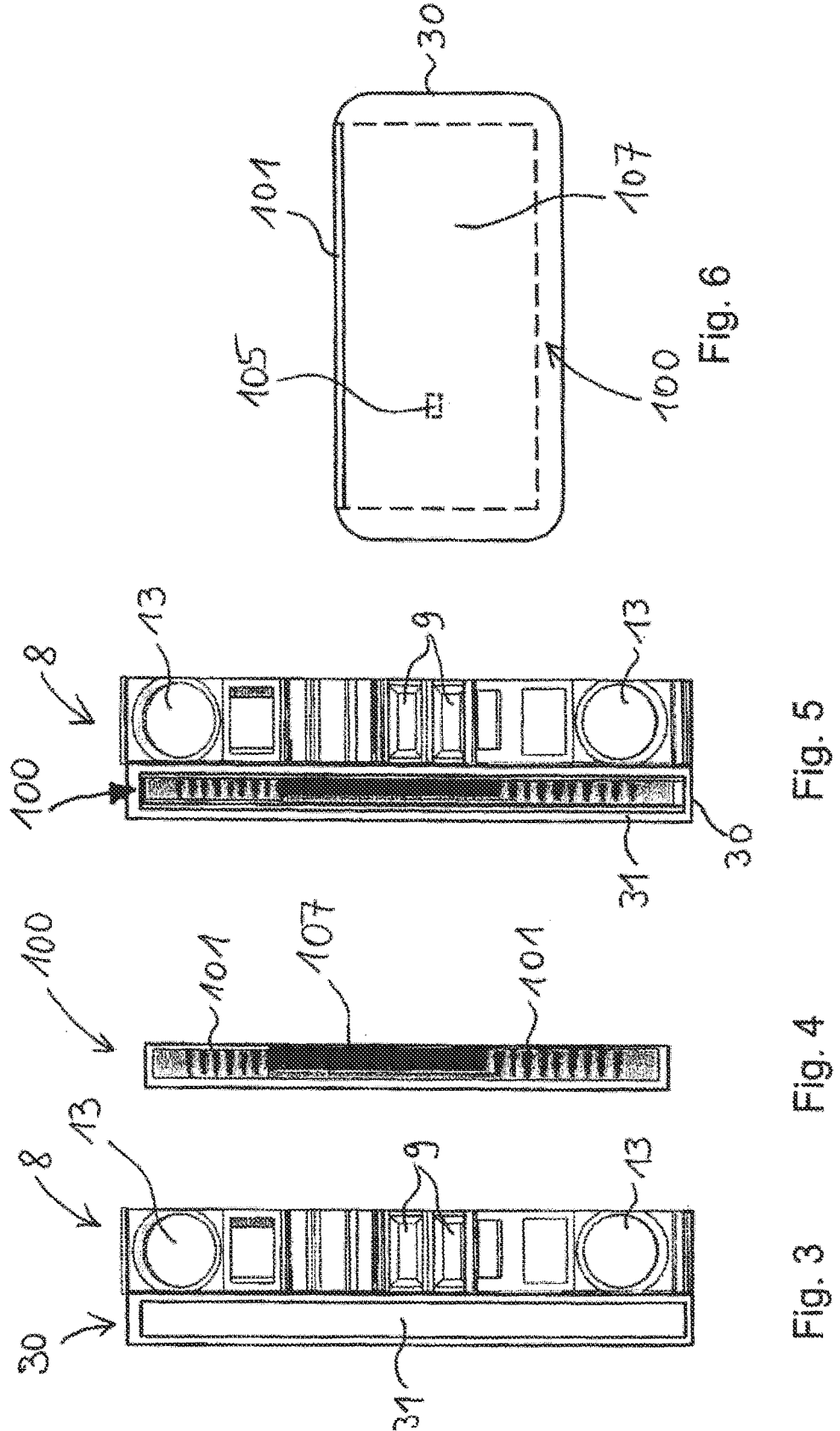
FIG. 3 is a front view of a terminal block and an end plate.
FIG. 4 is a sensor device.
FIG. 5 shows the arrangement according to FIG. 3, including a sensor device inserted therein according to FIG. 4.
FIG. 6 is a side view of the end plate with the sensor device according to FIG. 5.

FIG. 3 shows a further option for housing a sensor device 100. A terminal 8 of the type previously described can be seen, namely in the viewing direction in which the conductor insertion openings 13 and the jumper slots 9 are viewed. As could already be seen in FIG. 1, the terminal block 8 can be formed in such a way that it has a housing which is open to one side. This housing is then to be sealed with an end plate 30. In one embodiment of the invention, the end plate 30 is used as an option to accommodate a sensor device 100. For this purpose, the sensor device 100 must be constructed relatively flat. FIG. 3 shows an alternative in such a way that the end plate 30 is widened somewhat in contrast to conventional end plates and that it comprises a receiving pocket 31 for receiving the sensor device 100.

FIG. 4 shows such a sensor device 100 in a comparable viewing direction as the components shown in FIG. 3. In this case, the antennas 101 and an intermediate connecting piece 107 can be seen. FIG. 5 shows the sensor device 100 inserted into the receiving pocket 31 of the end plate 30.

So that the arrangement according to FIG. 5 permits good measuring of a current flowing through the terminal block 8, the current sensor 105 of the sensor device 100 must be placed accordingly. This is shown in FIG. 6. Due to the illustrated placement of the current sensor 105, it is arranged approximately at the level of the busbar 11 of the terminal block 8, so that in turn reliable current measuring is possible. The dotted line shows the spatial extent of the connecting piece 107 arranged in the pocket 31, which, for example, can be formed as a printed circuit board.

Figures 7, 8, 9:
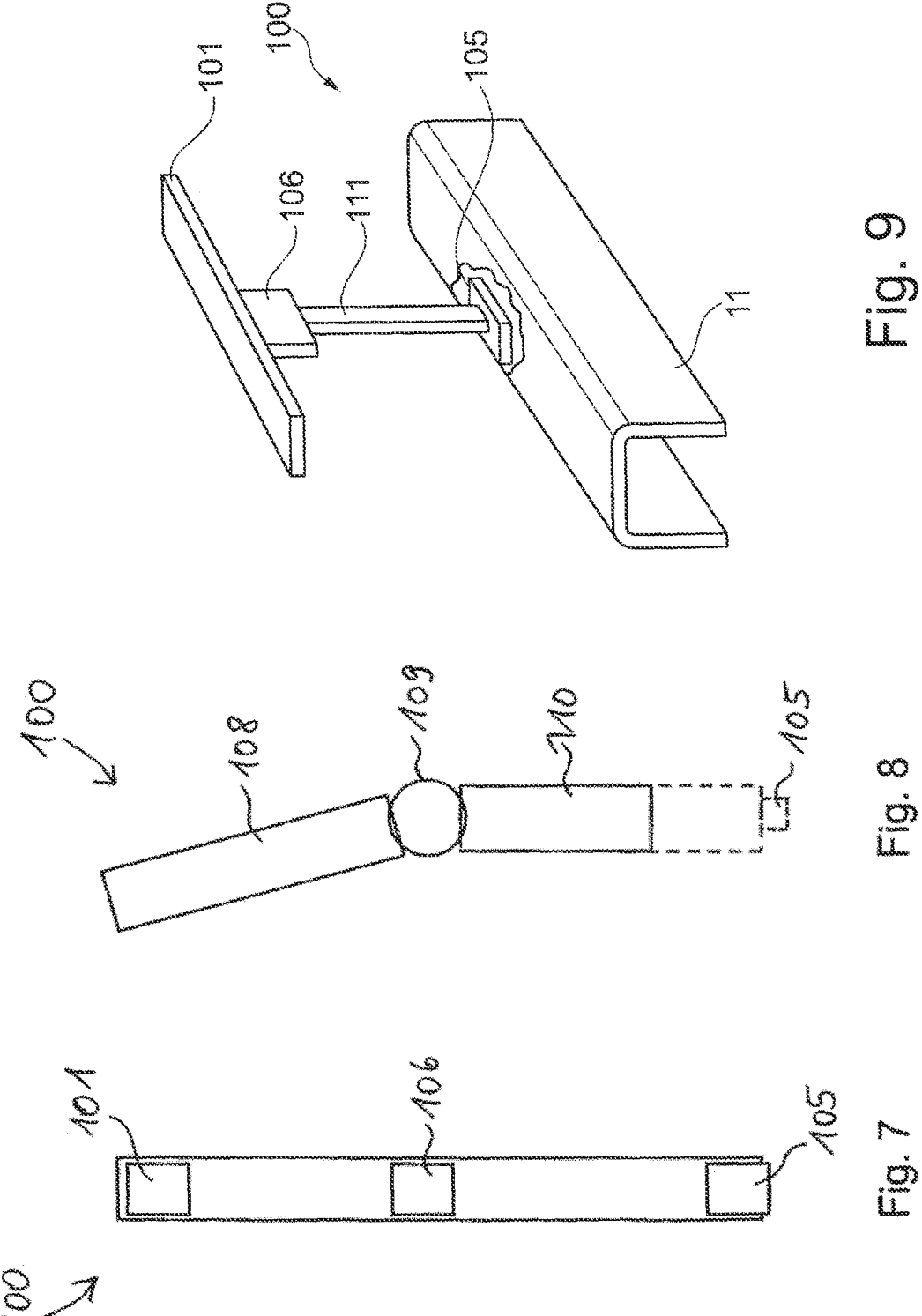
FIGS. 7 to 9 show different structural embodiments of sensor devices.

FIG. 7 shows the sensor device 100 already described with reference to FIG. 2 in a separate view. This embodiment of the sensor device 100 is particularly suitable for insertion into a slot of a terminal block because of its narrow, elongated design.

FIG. 8 shows a variant of a sensor device 100, which also has a narrow, elongated shape. In contrast to the previously described embodiments, the sensor device 100 is divided into a first section 108 and a second section 110. The first section 108 is connected via a joint 109 to the second section 110. The joint 109 can be designed, for example, as a ball joint or a planar joint. This embodiment allows for even greater flexibility when adapting the sensor device 100 to specific installation situations. Thus, for example, the sensor 105 may be located in the second section 110. The antenna 101 may be arranged in the first section 108. The first section 108 may altogether be formed as an antenna. This allows for the sensor device to be well adapted to the conditions of the wireless transmission, in particular by means of a suitable alignment of the antenna 101 to the readout device.

The sensor device may also altogether be formed as an angled sensor module, for example in that a fixed angle of e.g. approximately 60 degrees or approximately 90 degrees is provided between a first region and a second region of the sensor module. In this case, the previously described joint 109 is not absolutely necessary.

FIG. 9 shows a further embodiment of a sensor device 100, which can be applied in various ways. Again, the antenna 101 is visible. The antenna 101 is connected to the sensor 105 by means of the electronic assembly 106 and, where appropriate, by an additional connecting element 111. In this way, a certain longitudinal extension and thus a certain distance is created between the antenna 101 and the sensor 105. This again makes it possible to position the sensor 105 close to the location at which the physical quantity is to be measured. The antenna 101 may, however, be placed closer, in the region of the readout device. Adapting to the particular circumstances required can be achieved by defining a certain length of the connecting element 111, for example.

The sensor device 100 according to FIG. 9, for example, can be arranged in the pocket 31 of the end plate 30, or it may be inserted in a slot of the terminal block. A further possibility to use the sensor device 100 consists in that, for example, it is fixedly integrated in a terminal block, e.g. in a high current terminal. In this case, the sensor device 100 would not be attached to the terminal block by the user, but instead would already be integrated there by the manufacturer in the manufacturing process.

Figure 10:
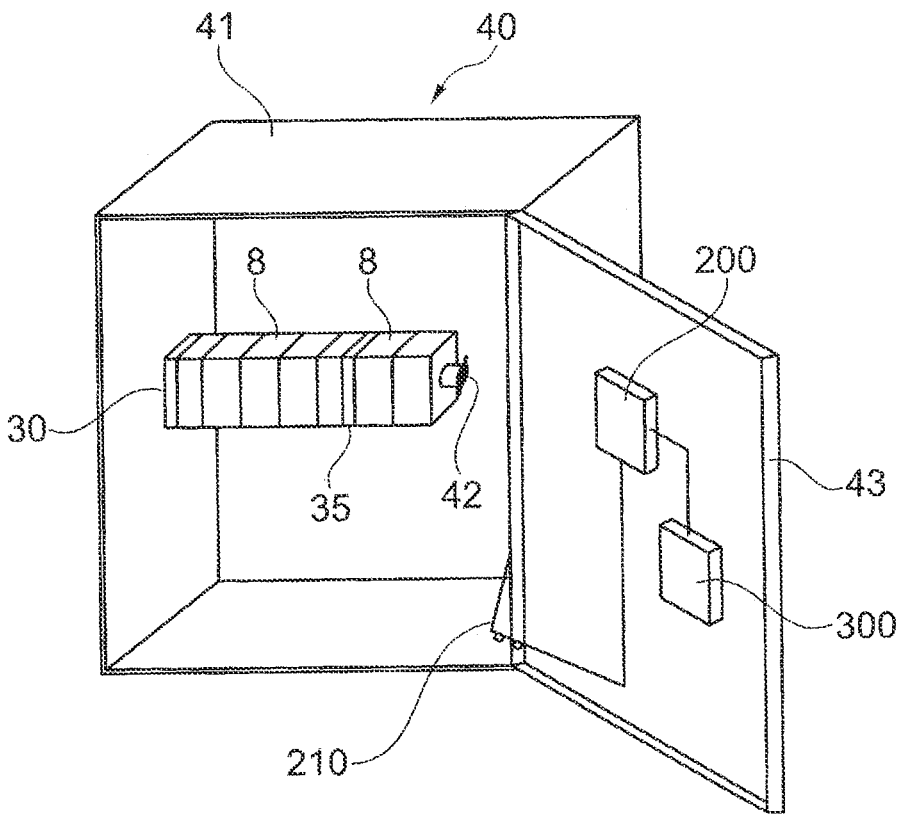
FIG. 10 is a control cabinet having a terminal block arrangement.

FIG. 10 shows a control cabinet 40 in a perspective view. The control cabinet 40 has a housing body 41 and a door 43. The door 43 is pivotally connected to the housing body 41. FIG. 10 shows the control cabinet 40 with an open door 43. A mounting rail 42 is located at a rear panel in the housing body 41. On the mounting rail 42, a plurality of terminal blocks 8 are attached to form a terminal block arrangement. In the terminal block arrangement, two sensor devices according to the invention are arranged, namely on the one hand the shape of the end plate 30 with the built-in sensor device described using FIGS. 3 to 5, as well as a sensor device designed as a structural unit 35 that is compatible with terminal blocks. This structural unit 35 is arranged between two terminal blocks 8 and, like the terminal blocks, is fastened to the mounting rail 42.

FIG. 10 also shows a readout device 200, which is set up for the wireless readout of measured values from the sensor devices. The readout device 200 may be connected to a wireless data transmission module 300 or contain the latter, for example, a wireless unit. In this way, the measured values of the sensor devices determined by the readout device can be wirelessly transmitted to a remote evaluation device.

Alternatively, the readout device 200 can also be connected via a cable 210 to the evaluation device, for example via a data network.

The readout device 200 and/or the wireless data transmission unit 300 may be arranged in the door 43, that is, on the inside of the door 43. When the door 43 is closed, the readout device 200 is located in the immediate vicinity of the antennas of the sensor devices.

Figure 11:
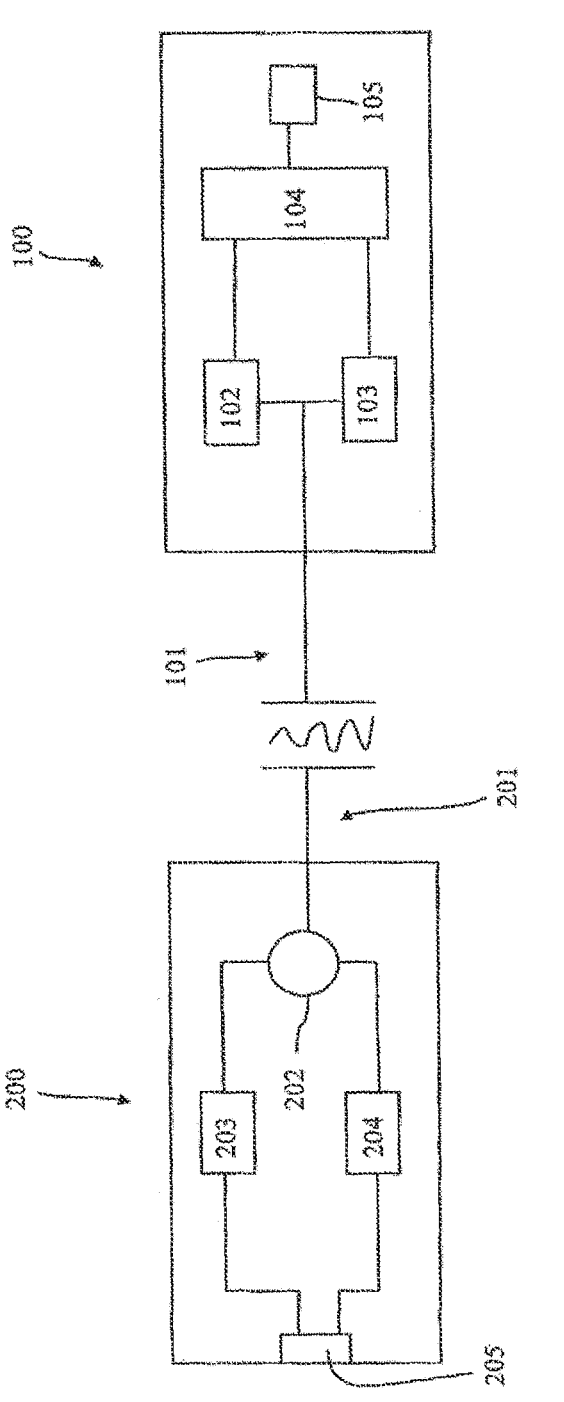
FIG. 11 is a block diagram view of a sensor device and a readout device.

FIG. 11 shows a sensor device 100 and a readout device 200 in a block diagram.

The sensor device 100 comprises the previously described antenna 101. A receiving branch 102 of the sensor device 100 and a transmitting branch 103 of the sensor device are connected with the antenna 101. Via the receiving branch 102, electromagnetic radiation received via the antenna 101, can be converted into electric energy, for example, which is used to supply power for the operation of the sensor device 100. For this purpose, the receiving branch 102 can have a rectifier circuit and a voltage multiplier circuit, for example.

Via the receiving branch 102, the sensor device 100 can also measure and decode data information contained in the electromagnetic waves received via the antenna 101. The measured data are then passed on to an internal control computer 104 of the sensor device 100. The control computer 104 is the central control element of the sensor device 100. The control computer 104 is connected to the sensor 105. The control computer 104 accordingly controls the sensor 105 and measures the desired physical quantity, for example, an electric current, via the sensor 105. In this way, the control computer 104 can output measured values of the physical quantity via the transmitting branch 103. The transmitting branch 103 then provides for a corresponding modulated output of a signal via the antenna 101. The antenna 101 may, for example, be formed as a dipole.

The readout device 200 has a transmitting branch 203 and a receiving branch 204. The transmitting branch 203 and the receiving branch 204 are coupled to an antenna 201 of the reading device 200 via a circulator 202. The antenna 201 can be designed as a dipole, for example.

The readout device 200 generates the corresponding signals in the transmitting branch 203 for the emission of the electromagnetic waves that are to be picked up by the sensor device 100 via the antenna 101. These electromagnetic waves contain the electrical energy needed for supplying the sensor device and may contain data signals.

The readout device 200 receives the data contained in the electromagnetic waves transmitted back by the sensor device 100 via the receiving branch 204 and makes them available at an output interface 205.

The data communication between the sensor device 100 and the readout device 200 can also include the transmission of an identification code from the sensor device 100 to the readout device 200.

Figure 12:
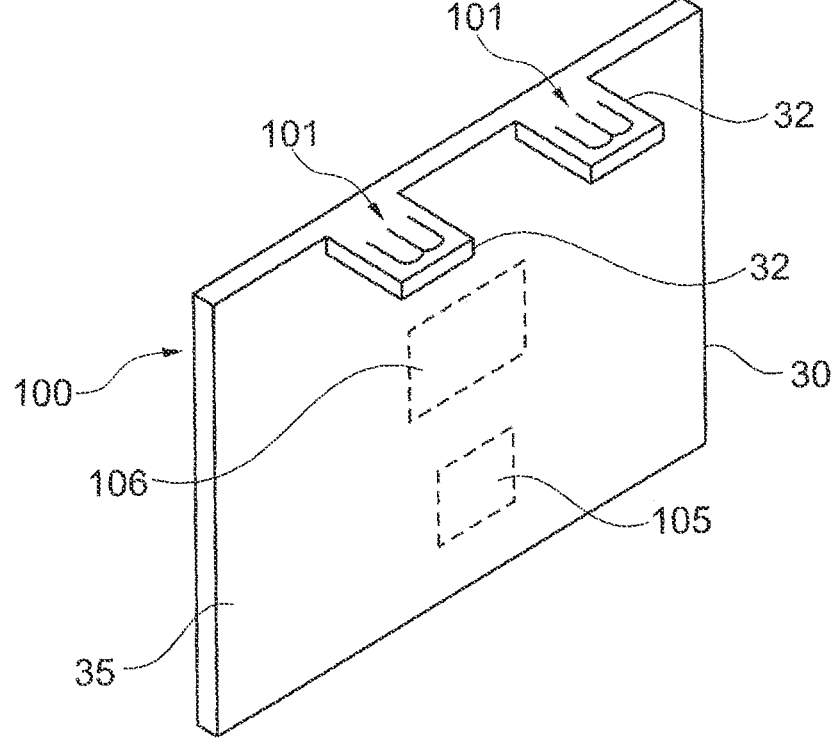
FIG. 12 is a further structural embodiment of a sensor device.

FIG. 12 shows an embodiment of the sensor module 100, in which in turn an end plate 30 is used. In contrast to the embodiment of FIGS. 3 to 5, the end plate 30 has a coverage area 35 to be arranged on the side of the terminal block and a front area 32 which is angled relative to the cover area 35. The front area 32 does not necessarily have to extend continuously along the entire longitudinal extension of the cover area 35, but may, for example, as can be seen in FIG. 12, be formed as one or more laterally protruding material tongues.

In this embodiment, the end plate 30 does not necessarily have to include the aforementioned pocket 31; it also does not have to be wider than usual end plates, at least not in the coverage area 35. In this embodiment, the sensor 105 and the electronics assembly 106 can be integrated in the end plate 30, namely in the coverage area 35. In contrast, the antennas 101 can be arranged in the angled front area 32. The tongues of the angled front area 32 can be placed in such a way that certain areas of the front side of the terminal block are not covered, in particular not the label fields, the conductor insertion openings and jumper slots.

For example, an angle of approximately 90 degrees can be present between the coverage area 35 and the front area 32.

FIG. 13 shows an embodiment of a terminal block 8 in which the electrical power is measured by providing two sensor devices, each with its own antenna 101. One sensor device is used to measure the current, the other sensor device to measure the voltage or at least one electrical potential. For example, the sensor devices can each be designed as RFID transponders. The one sensor device can, e.g. comprise a magnetic field sensor used to measure a magnetic field measurement and thus a signal characterizing the current flowing on the busbar.

The other transponder has one or more connections for the potential tap in order to measure potential values. The transponders then transmit the measured magnetic field values and potential values to the readout device 200. There, or in a separate evaluation device, voltage values and current values and from these, a value of electric power, can be determined from the transmitted values.

FIG. 14 shows a terminal block 8, which is equipped in a way that is comparable to that of the terminal block of FIG. 13. In contrast to FIG. 13, where the antennas 101 and accordingly the RFID transponders are arranged one above the other, FIG. 14 shows an arrangement in each case at the sides of the terminal block 8. The respective antennas 101 then extend with their predominant longitudinal extent (greatest longitudinal dimension) parallel to the side walls of the terminal block 8.

The sensor devices for the current measurement and/or the voltage measurement can also be integrated in an end plate 30. In this case, the end plate 30 can be equipped with one or more connections for the potential tap, for example with at least 4 connections for the potential tap. In this case, a terminal block provided with an end plate 30 equipped in this way can serve as a connecting element for an electrical line to be measured, e.g. for the neutral conductor. Then, one of the connections for the potential tap can be connected to the voltage tester slot of the terminal block. The sensor device, e.g. an RFID tag, can then measure the potential value of the connected electrical conductor, for example the neutral conductor, and transmit it to the readout device 200. Another free connection for the voltage tap can be connected with the voltage tap of a different terminal block, for example with a terminal block carrying phase L1. The potential value measured via this connection is also transmitted to the readout device 200. In the readout device 200, the voltage value can then be determined by subtracting the potential values, so that the value of the electric power can be determined along with the measured current value.

FIG. 15 shows a terminal block arrangement having a plurality of terminal blocks 8, in this case, by way of example, 5 terminal blocks, each equipped with sensor devices of the inventive type, wherein only the respective antennas 101 of these sensor devices are visible in FIG. 15. For example, a terminal block can be formed for connecting the neutral conductor, and 3 terminal blocks for connecting the respective phase conductor L1, L2, L3. This allows for the realization of an interconnection for three-phase power measurement on the terminal block arrangement by means of the inventive sensor devices.

Figure 16:
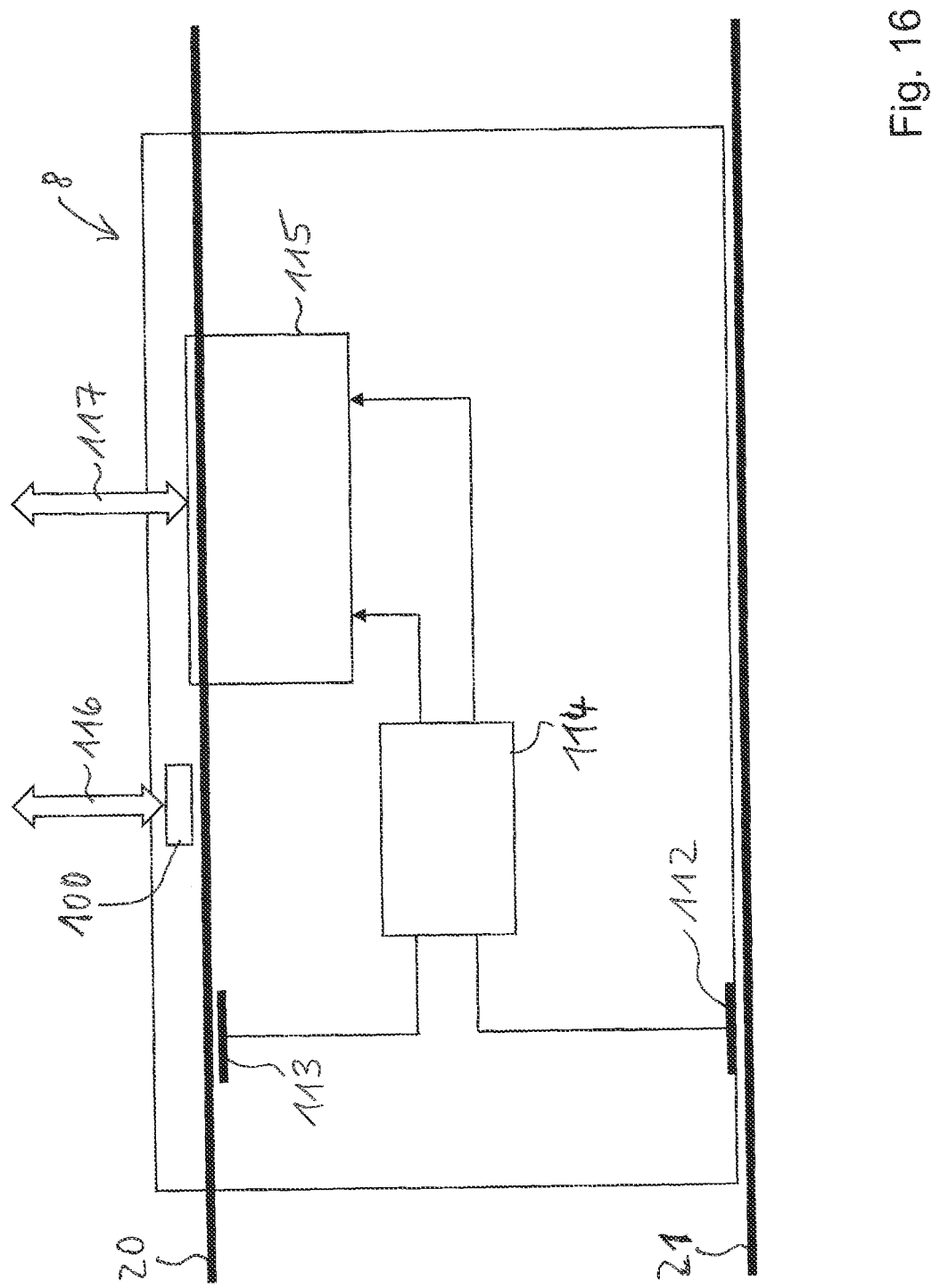
FIG. 16 is a schematic view of a terminal block having a sensor device.

FIG. 16 shows an embodiment of a terminal block 8, which is provided with a sensor device 100 for current measurement and a further sensor device for voltage measurement. The sensor device 100 for measuring current can be designed according to one of the previously described embodiments. The sensor device 100 communicates via wireless data transmission 116 with the readout device 200. The sensor device for the voltage measurement is explained in more detail below.

It is assumed that the voltage between the electrical conductors 20, 21 is to be measured. For example, the conductor 21 can be the neutral conductor; the conductor 20 a phase conductor L1, L2 or L3. FIG. 16 shows an embodiment variant with contactless capacitive voltage measuring. A capacitive measuring electrode 112 is arranged in the vicinity of the electrical conductor 21. Another capacitive measuring electrode 113 is arranged in the vicinity of the electrical conductor 20. The measuring electrodes 112, 113 are connected via electrical lines to a circuit 114 or a network for processing the signals of the capacitive measuring electrodes 112, 113. In the circuit 114, for example, the respective voltage value, i.e. the difference between the voltage potentials of the electrical conductors 20, 21 and/or a phase information with respect to the phase position of the voltage, can be directly measured. The quantities determined in this way can be output as analog electrical signals or digital signals to transducer electronics 115. Via the transducer electronics 115, wireless data transmission 117 of the measured values to the readout device 200 is then carried out.

The circuit 114 may have, e.g., a filter circuit or filter networks for filtering the signals picked up via the measuring electrodes 112, 113. The circuit 114 can also comprise a measurement amplifier and/or a high-voltage analog-to-digital converter.

Alternatively, the voltage potentials conducted to the circuit 114 or at least one of these voltage potentials can be directly tapped by means of galvanic coupling with the respective conductor 20, 21.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A sensor device for a terminal block arrangement having terminal blocks, the sensor device comprising:
   at least one sensor to measure a physical quantity of the terminal block arrangement or of at least one of the terminal blocks of the terminal block arrangement; and
   an antenna,
   wherein the sensor device is formed as a lateral end plate of the terminal block arrangement,
   wherein the at least one sensor is accommodated in a receiving pocket of the lateral end plate, the receiving pocket being a slot that has an open end, and
   wherein an area of the sensor device comprising the antenna partially protrudes from the open end of the receiving pocket of the lateral end plate of the terminal block arrangement.

2. The sensor device according to claim 1, wherein the sensor device is formed as a structural unit that is separate from the terminal block arrangement, wherein the sensor device is fastened on the at least one of the terminal blocks of the terminal block arrangement.

3. The sensor device according to claim 1, wherein the sensor device comprises a wireless transmission unit, which is set up for a wireless transmission of measured values from the at least one sensor of the sensor device to a readout device separate from the sensor device.

4. The sensor device according to claim 1, wherein the sensor device has a first wireless transmission unit for a transmission of measured values from a current measured by the sensor device and at least one second wireless transmission unit for a wireless transmission of measured values from a voltage or potential measured by the sensor device.

5. The sensor device according to claim 1, wherein the sensor device is set up for wireless supply of electrical energy which is necessary for operation of the sensor device.

6. The sensor device according to claim 1, wherein the sensor device has an energy harvesting device which is set up to wirelessly receive electrical energy from an environment of the sensor device and to provide electrical energy for an electrical supply of components of the sensor device.

7. The sensor device according to claim 1, wherein the sensor device has an RFID transponder.

8. The sensor device according to claim 1, wherein the lateral end plate predominantly surrounds the at least one sensor and/or an electronic assembly of the sensor device as a housing.

9. The sensor device according to claim 1, wherein the sensor device is formed as a structural unit that is arranged at an end of the terminal block arrangement and is adapted to be snapped onto a support rail carrying the terminal blocks.

10. The sensor device according to claim 1, wherein the at least one sensor is a current sensor or a contactless current sensor.

11. The sensor device according to claim 1, wherein the at least one sensor is a voltage sensor, or the sensor device includes a further sensor that is a voltage sensor.

12. The sensor device according to claim 1, wherein the sensor device is set up for measuring at least two or at least three voltage potentials of the terminal block arrangement or of at least one of the terminal blocks of the terminal block arrangement.

13. The sensor device according to claim 1, wherein the sensor device is set up to measure a phase position of a current measured by the sensor device with respect to a voltage potential measured by the sensor device.

14. A terminal block arrangement comprising:
at least two terminal blocks; and
at least one sensor device according to claim 1.

15. The terminal block arrangement according to claim 14, wherein each of the at least two terminal blocks of the terminal block arrangement have a sensor device according to claim 1.

16. A control cabinet having at least one terminal block arrangement according to claim 14.

17. The control cabinet according to claim 16, wherein a readout device for reading out the measured values of the at least one sensor device of the terminal block arrangement is disposed in the control cabinet.

18. The control cabinet according to claim 17, wherein the readout device is arranged on an inside of a door of the control cabinet.

19. A readout device for reading out measured values from the at least one sensor device of the terminal block arrangement according to claim 14.

20. The readout device according to claim 19, wherein the readout device comprises an RFID reading device.

21. The readout device according to claim 19, wherein the readout device has a gateway.

22. The readout device according to claim 19, wherein the readout device is set up to determine a power measured value using current and voltage measured values that the readout device has read out from the at least one sensor device of the terminal block arrangement.

23. A terminal block with at least one sensor device according to claim 1 arranged on or in the terminal block.

24. A sensor device for a terminal block arrangement having terminal blocks, the sensor device comprising:
at least one sensor to measure a physical quantity of the terminal block arrangement or of at least one of the terminal blocks of the terminal block arrangement
wherein the sensor device is formed as a lateral end plate of the terminal block arrangement, and
wherein the lateral end plate has a coverage area that is laterally arranged on the terminal block arrangement to cover a lateral opening of the terminal block arrangement, wherein the lateral end plate is formed as an angled end plate which has an angled front area, the angled front area being arranged at an angle to the coverage area of the lateral end plate, and wherein the angled front area, when the lateral end plate is mounted on the terminal block arrangement, covers at least a portion of a front side of the terminal block arrangement.

25. The sensor device according to claim 24, wherein the at least one sensor is arranged at a position on the coverage area of the lateral end plate so that when the lateral end plate is arranged laterally on the terminal block arrangement, the at least one sensor is positioned in area of a busbar of the terminal block arrangement.

26. The sensor device according to claim 25, wherein the at least one sensor is arranged on the coverage area of the lateral end plate so as to be spaced apart from outer edge regions of the lateral end plate.

* * * * *